United States Patent
Burke et al.

(10) Patent No.: US 6,638,639 B1
(45) Date of Patent: Oct. 28, 2003

(54) TURBINE COMPONENTS COMPRISING THIN SKINS BONDED TO SUPERALLOY SUBSTRATES

(75) Inventors: Michael A. Burke, Pittsburgh, PA (US); Paula D. Freyer, Cranberry Township, PA (US); Mohan A. Hebbar, Oviedo, FL (US); Brij B. Seth, Maitland, FL (US); Gary W. Swartzbeck, North Huntingdon, PA (US); Thomas Walter Zagar, Winter Springs, FL (US)

(73) Assignee: Siemens Westinghouse Power Corporation, Orlando, FL (US)

( * ) Notice: Subject to any disclaimer, the term of this patent is extended or adjusted under 35 U.S.C. 154(b) by 0 days.

(21) Appl. No.: 09/509,621

(22) PCT Filed: Oct. 27, 1998

(86) PCT No.: PCT/US98/22787

§ 371 (c)(1),
(2), (4) Date: Jul. 6, 2000

(87) PCT Pub. No.: WO99/33605

PCT Pub. Date: Jul. 8, 1999

Related U.S. Application Data

(60) Provisional application No. 60/063,640, filed on Oct. 27, 1997.

(51) Int. Cl.[7] .............................. B32B 15/00; F03B 3/12

(52) U.S. Cl. ...................... 428/583; 428/594; 428/606; 428/680; 416/241 R; 416/95

(58) Field of Search ................................ 416/241 B, 95, 416/97 R, 241 R; 428/586, 583, 573, 582, 594, 600, 601, 606, 615, 655, 650, 680, 131, 132, 133, 134

(56) References Cited

U.S. PATENT DOCUMENTS

| | | | |
|---|---|---|---|
| 1,829,179 A | 10/1931 | Back | |
| 3,067,982 A | 12/1962 | Wheeler, Jr. | |
| 3,342,455 A | 9/1967 | Fleck et al. | |
| 3,536,121 A | 10/1970 | Piearcey | |
| 3,753,794 A | 8/1973 | Paulonis et al. | |
| 3,940,268 A | 2/1976 | Catlin | |
| 3,981,344 A | 9/1976 | Hayes et al. | |
| 4,059,217 A | 11/1977 | Woodward | |
| 4,089,456 A | 5/1978 | Toppen et al. | |
| 4,096,615 A | 6/1978 | Cross | |
| 4,186,473 A | 2/1980 | Cross et al. | |
| 4,311,433 A | 1/1982 | Bratton et al. | |
| 4,364,160 A | 12/1982 | Eiswerth et al. | |
| 4,376,004 A | 3/1983 | Bratton et al. | |
| 4,417,381 A | 11/1983 | Higginbotham | |
| 4,447,188 A | 5/1984 | Davis et al. | |
| 4,475,980 A | 10/1984 | Rhemer et al. | |
| 4,507,051 A | 3/1985 | Lesgourgues et al. | |
| 4,529,452 A | 7/1985 | Walker | |
| 4,538,331 A | 9/1985 | Egan et al. | |
| 4,592,120 A | 6/1986 | Egan et al. | |
| 4,611,752 A | 9/1986 | Jahnke | |
| 4,614,296 A | 9/1986 | Lesgourgues | |
| 4,637,448 A | 1/1987 | Burke et al. | |

(List continued on next page.)

*Primary Examiner*—Deborah Jones
*Assistant Examiner*—Jennifer McNeil
(74) *Attorney, Agent, or Firm*—Eckert Seamans Cherin & Mellott, LLC

(57) ABSTRACT

High efficiency, thin-walled turbine components such as turbine blade airfoils comprise a superalloy substrate covered by a thin skin. The thin skin may be bonded to the inner spar structure of a turbine blade airfoil by a transient liquid phase bonding process. The inner spar preferably comprises a cast single crystal nickel base superalloy. The thin skin may comprise a single crystal or polycrystalline nickel base superalloy or the like.

7 Claims, 3 Drawing Sheets

U.S. PATENT DOCUMENTS

| | | |
|---|---|---|
| 4,659,288 A | 4/1987 | Clark et al. |
| 4,700,881 A | 10/1987 | Ryan |
| 4,768,700 A | 9/1988 | Chen |
| 4,784,572 A | 11/1988 | Novotny et al. |
| 4,784,573 A | 11/1988 | Ress, Jr. |
| 4,796,343 A | 1/1989 | Wing |
| 4,817,858 A | 4/1989 | Verpoort |
| 4,869,645 A | 9/1989 | Verpoort |
| 4,921,405 A | 5/1990 | Wilson |
| 5,061,154 A | 10/1991 | Kington |
| 5,071,059 A | 12/1991 | Heitman et al. |
| 5,240,518 A | 8/1993 | Wortman et al. |
| 5,318,406 A | 6/1994 | Bardes |
| 5,358,029 A | 10/1994 | Baveja et al. |
| 5,419,039 A | 5/1995 | Auxier et al. |
| 5,503,532 A | 4/1996 | Schilling |
| 5,509,980 A | 4/1996 | Lim |
| 5,611,670 A | 3/1997 | Yoshinari et al. |
| 5,621,968 A | 4/1997 | Kikkawa et al. |
| 5,626,462 A * | 5/1997 | Jackson et al. |

* cited by examiner

TURBINE COMPONENTS COMPRISING THIN SKINS BONDED TO SUPERALLOY SUBSTRATES

This application claims the benefit of U.S. Provisional Application Ser. No. 60/063,640 filed Oct. 27, 1997.

GOVERNMENT CONTRACT

This invention was made with Government support under Contract No. 70NANB5H1131 awarded by the United States Department of Commerce. The Government has certain rights in this invention.

FIELD OF THE INVENTION

The present invention relates to turbines, and more particularly relates to blades and other turbine components comprising thin skins bonded to superalloy substrates.

BACKGROUND INFORMATION

State-of-the-art blades and vanes that are employed in modern, high efficiency power generation combustion turbine engines rely on high quality materials such as single crystal alloys and precise control of the part's internal and external dimensions. Because of the large size of these parts, cost-effective manufacturing is being pursued by several routes.

Land-based gas turbines, such as the advanced turbine system (ATS) which is currently under development, require cost-effective high performance components fabricated from advanced materials. First and second row turbine blades and vanes include complex internal and external geometries, and should be fabricated from defect-free materials.

Thin wall structures would be useful for modern turbine blade designs in order to improve operating efficiency. However, such thin wall structures greatly inhibit manufacturing of the blades. In particular, the control of thin wall sections over the very long distances that are required for land based turbine airfoils is very difficult, and leads to very low casting productivity and high component costs. These productivity and cost problems are especially severe for the single crystal alloys that are called for in ATS and next generation turbine engines.

SUMMARY OF THE INVENTION

In accordance with the present invention, high efficiency thin walled turbine components such as turbine blades are manufactured by fabricating a superalloy substrate such as a single crystal inner spar structure and bonding a thin skin over the substrate. For example, a substrate in the form of a turbine blade airfoil spar may include a corrugated or intermittently raised surface such as raised pins or walls onto which a thin skin can be bonded. The thin skin can be of single crystal or a polycrystalline material, and has a preferred thickness of from about 0.025 to 0.125 cm (0.01 to 0.05 inch). The skin is bonded to the substrate by thermal processes such as transient liquid phase bonding and/or hot isostatic pressing.

An aspect of the present invention is to provide a method of making a thin walled turbine component. The method includes the steps of providing a superalloy substrate including multiple extensions on its surface, applying a thin skin over the substrate, and bonding the thin skin to the extensions of the substrate.

Another aspect of the present invention is to provide a turbine component comprising a superalloy substrate, a thin skin bonded to a superalloy substrate, and at least one cooling channel located between the substrate and the thin skin. In a preferred embodiment, the substrate comprises an airfoil spar made of a single crystal nickel base superalloy.

These and other aspects of the present invention will be more apparent from the following description.

DETAILED DESCRIPTION

Figure 1:
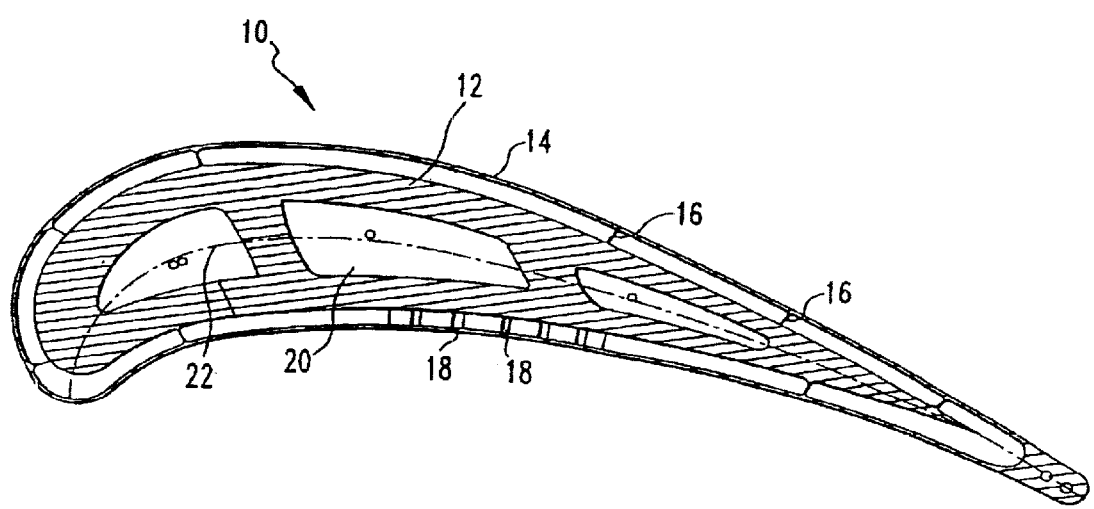
FIG. 1 is a cross-sectional view of a turbine blade airfoil showing a thin skin bonded to a superalloy turbine blade spar in accordance with an embodiment of the present invention.

In accordance with the present invention, a thin walled structure suitable for highly cooled gas turbine blades can be fabricated by applying a thin skin of sheet material over a central cast element using transient liquid phase bonding or the like. The process can be controlled so that the bonded material exhibits a substantially continuous structure and demonstrates properties in the bond region that are approximately equivalent to those of the metal alloys that were joined. One embodiment of the present invention comprises joining single crystal skins over thicker single crystal substrates. Another embodiment comprises applying highly oxidation resistant polycrystalline alloys over high temperature, high strength superalloys such as single crystal nickel base superalloys. In another embodiment, the thin skin may be an oxide dispersion strengthened (ODS), directionally recrystallized nickel or iron base superalloy.

In one embodiment of the present invention, casting the central sections of turbine blades without internal cores will lead to improved parts tolerance and yield. Fabrication of the central section from multiple pieces by bonding may also be desirable to achieve the desired productivity. After casting, the surface of the central spar can be machined to precise contour, and a skin of thin sheet metal or the like can be easily and accurately applied over it. This avoids the need to simultaneously control the various external and internal tolerances that must be maintained in a single piece casting process, and improves overall component manufacturing yields for advanced turbine blades.

It is desired to make turbine blades with very thin walls in order to promote component cooling. The wall effectively separates the portion of the blade that must withstand high stresses from the portion that must withstand the highest temperatures and potential environmental attack.

As used herein, the term "turbine blade" means a component of a land based gas turbine, including rotating blades and stationary vanes of such turbines. Rotating blades typically comprise an airfoil portion and a root portion including a platform. Stationary vanes typically comprise a central airfoil portion and two shroud portions which can be considered to be equivalent to the root portions of the rotating blades. The turbine blades are relatively large, preferably having a total length of at least about 12 inches, an airfoil chord of at least about 4 inches, and an airfoil thickness of at least about 5/16 inch. For rotating blades, the minimum length of the airfoil portion of the blade is preferably at least about 7 inches, while the minimum length of the root portion of the blade is at least about 5 inches. The root portion of such rotating blades preferably has a width of at least about 3 inches. The present turbine blades typically have a total length of about 18 inches, with the airfoil portion having a length of about 11 inches and the root portion having a length of about 7 inches. The chord of the airfoil portion is typically about 6 inches, while the thickness of the airfoil portion is typically about 1 inch. The root portion has a typical width of about 4 or 5 inches. For rotating blades, the airfoil portion accounts for approximately 20 percent of the total weight of the blade, while the root portion accounts for approximately 80 percent of the total weight. The present turbine blades preferably weigh more than 10 pounds, typically from about 20 to about 30 pounds. This is in comparison with aircraft turbine blades which typically weigh about 2 pounds and have substantially smaller dimensions. In addition to turbine blades, other turbine components that may be fabricated in accordance with the present invention include combuster cams and hot section transitions and ducts.

FIG. 1 is a cross-sectional view of a turbine blade airfoil 10 in accordance with an embodiment of the present invention. The airfoil 10 includes a substrate 12 made of any suitable superalloy, preferably a single crystal nickel base superalloy. A thin skin 14 is bonded over the substrate 12. Several walls 16 extending between the substrate 12 and thin skin 14 form multiple cooling channels which run along the length of the airfoil 10. The thin skin 14 is bonded to the substrate 12 by means of multiple extensions in the form of generally cylindrical pins 18. Although not shown in FIG. 1, the pins 18 are located substantially entirely around the outer surface of the substrate 12 in order to provide the desired number of bond sites for the thin skin 14. The pins 18 may be formed integrally with, or separately from, the substrate 12. For example, the pins 18 may be integrally formed from the substrate 12 by casting the pins and the substrate, or by machining the pins from the substrate.

As shown in FIG. 1, the airfoil substrate 12 may optionally include at least one internal passage 20. The substrate 12 may be provided in the form of a single component casting. For some turbine blade applications, the substrate 12 is preferably provided as two or more separate castings which are subsequently bonded together. In this case, the substrate 12 may be cast as two separate components which are bonded along a blade camber-line 22 of the airfoil.

As more fully described below, the substrate 12 is preferably made of a superalloy such as a single crystal nickel base superalloy such as CMSX-4 or the like. The thin skin 14 may also be made from a single crystal nickel base superalloy. Alternatively, the thin skin 14 may be made from a polycrystalline nickel base superalloy or the like. Suitable thin skin materials include directionally solidified or directionally recrystallized nickel or iron base superalloys. Furthermore, the thin skin may be made from other materials such as oxidation and corrosion resistant alloys of the NiCrAlY or CoNiCrAlY type, nickel base ODS alloys, iron base ODS alloys and wrought cobalt base alloys. For example, suitable skin alloys may include IN718, HastalloyX, Haynes 236, Inconel 617, Inconel MA754, PM2000 and Haynes 188. The thin skin 14 may be provided as a single layer, or as multiple layers. For example, the thin skin may comprise a metallic underlayer having at least one thermal barrier coating thereon.

The thin skin 14 preferably has a thickness of from about 0.13 to 2.5 mm (5 to 100 mils). More preferably, the thin skin 14 has a thickness of from about 0.25 to 1.25 mm (10 to 50 mils). A particularly preferred thin skin thickness is about 0.5 mm (20 mils).

The extensions between the substrate 12 and the thin skin 14, such as the pins 18 shown in FIG. 1, preferably extend from about 0.25 to about 6.25 mm from the surface of the substrate 12. More preferably, the extensions extend from about 0.5 to about 1.25 mm from the surface of the substrate 12. A gap having a thickness of from about 0.25 to about 6.25 mm is thus formed between the substrate 12 and the thin skin 14 in order to provide a cooling channel. More preferably, the cooling channel has a thickness of from about 0.5 to about 1.25 mm.

As shown in FIG. 1, the high temperature skin 14 is separated from the lower temperature substrate 12 by an array of pins 18, spars, short walls or the like. Because the skin is so thin, it is critical to maintain its thickness to within tight tolerances in order to maintain the correct metal temperatures and heat flow. By producing a conforming skin using sheet metal processing methods such as direct casting or sheet metal forming, a contoured skin can be produced that will accurately fit over the substrate.

In one embodiment, the substrate can be formed by directly casting to shape, including the surface protrusions that are required to mechanically support the load transfer from the skin as well as to provide sufficient airflow to cool the skin. The surface of the substrate can be formed directly to shape with only minimal machining/contouring of the extremities of the surface features.

Alternatively, the array of supports can be fabricated by machining the surface from a solid section by a suitable low stress machining method such as electrodischarge machining (EDM) or by using low current or electrochemical machining (ECM) such that recrystallization of the single crystal components will not be induced during heat treatment or service. The process may preferably comprise casting to near net shape/profile, and final finishing to precise tolerance using processes such as EDM, ECM or the like.

In a preferred embodiment, the thin skin is bonded to the spar structure using a transient liquid phase bonding process. A bonding foil may be applied as a single sheet of foil across the solid surface of the skin to ensure that the bond foil is applied to all of the possible regions that may be subjected to bonding. Alternatively, in the case that the bonding region forms only a small fraction of the skin surface, the foil may be punched, cut or etched away from regions that will not be sandwiched between the support structure and the skin. In this latter case, the perforated sheet may need to be more precisely positioned to ensure the presence of bonding material between the skin and all of the supporting elements, e.g., pins, fins, etc.

During bonding it is important that all of the surfaces to be bonded are maintained in tight contact. Bonding foils having thicknesses of about 0.0025 cm (0.001 inch) are preferably used for parts that are fitted up to within +/−0.0025 cm (0.001 inch). This requirement means that the parts must be pressed together quite closely for bonding. The load across the bond face that is required for good bonding is relatively small, e.g., from about 1 to about 5 ksi. Loading on the overall part may be required to flatten the mating surfaces and to elastically distort the parts to close the bonding gaps rather than to provide stress across the bonding surfaces. For planar parts, these stresses are readily achieved by placing the thin skin beneath the bond foil and the substrate, so that with gravity, additional weight or fixture loading, the proper mating of the parts is facilitated. For contoured parts where the surface to be bonded is not planar, the loading to ensure surface mating is preferably provided by mechanical fixturing using point or surface loading across the interface. Pressure may also be provided by a hydrostatic system where the skin is held against the substrate by hydrostatic gas forces. In this case, the gas pressurizing and bond heat treatment may be accomplished by a HIP thermal cycle. Under these conditions it may be preferable to contain the fitted-up, non-bonded parts within a disposable shaped can, e.g. of stainless steel, that can be evacuated and sealed prior to HIPing and stripped and disposed of after HIPing.

Figure 2:
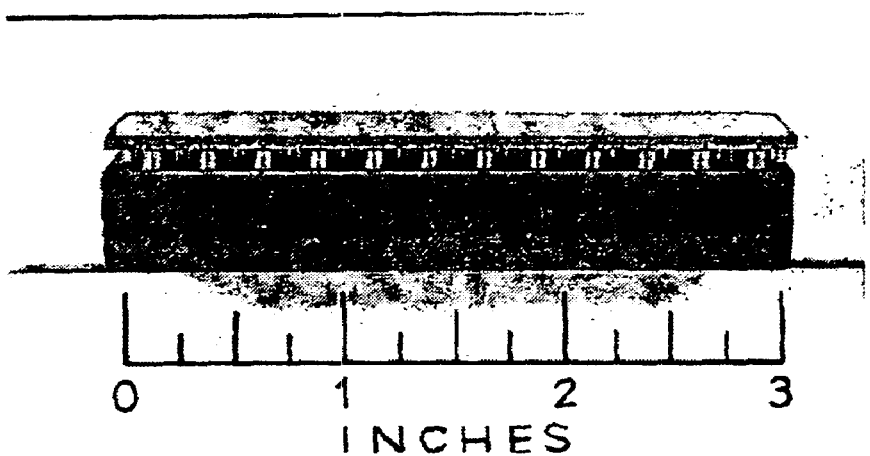
FIG. 2 is a side view of a thin skin bonded to a superalloy substrate in accordance with an embodiment of the present invention.
Figure 3:
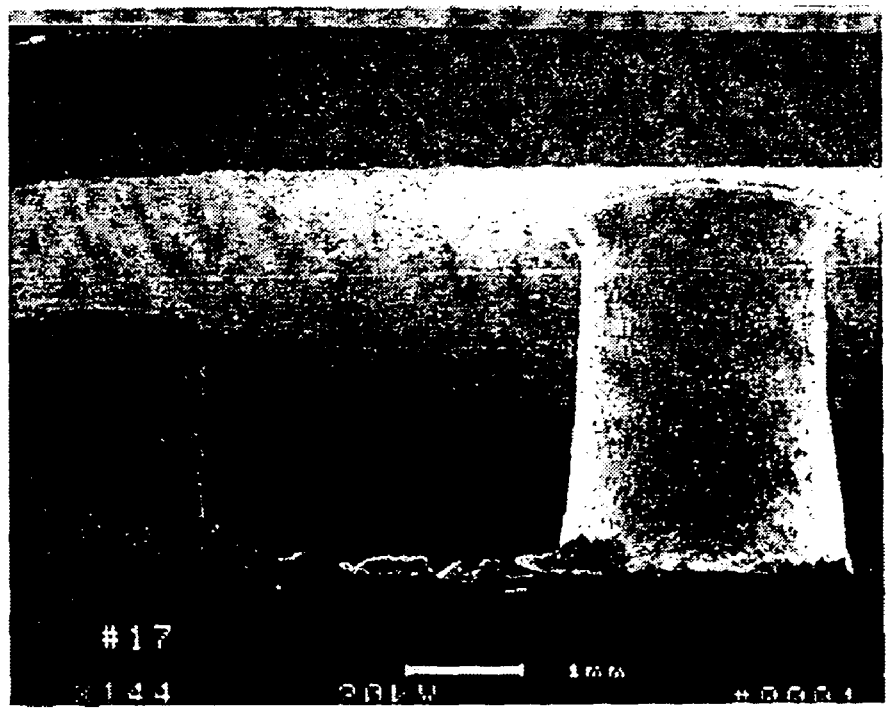
FIG. 3 is a magnified view of FIG. 2.

FIG. 2 shows a thin wall structure made in accordance with the present invention comprising a single crystal skin bonded to a pin array of a single crystal spar. FIG. 3 shows the thin wall structure at higher magnification.

For bonding single crystal skins to single crystal substrates bond conditions are controlled. For example, for bonding CMSX-4 skins to CMSX-4 substrates, typical conditions are: Ni-Flex 110 1.3 weight percent B bond foil bonded in the as-cast condition with EDM surface preparation at 2,250° F. for 4 hours. The parts may be subsequently solution and precipitation heat treated.

Figure 4:
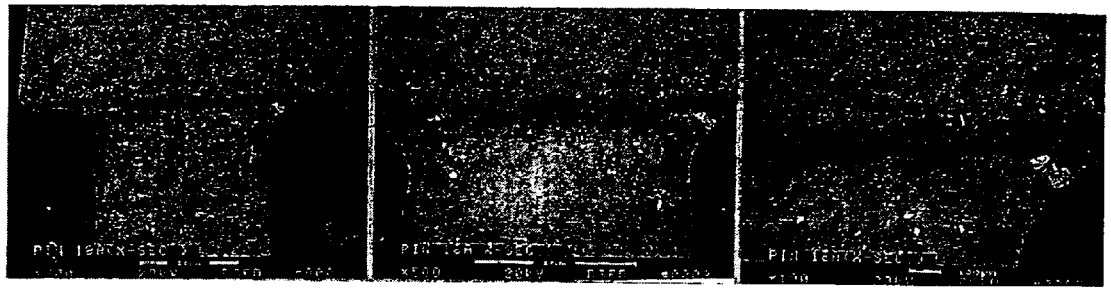
FIG. 4 is a series of photomicrographs at varying magnifications showing the joint between a thin skin and a pin of a superalloy substrate in accordance with an embodiment of the present invention.

FIG. 4 illustrates the joint between a single crystal pin and a single crystal thin wall, demonstrating how such bonding provides an excellent fillet fill around the pin surface.

Figure 5:
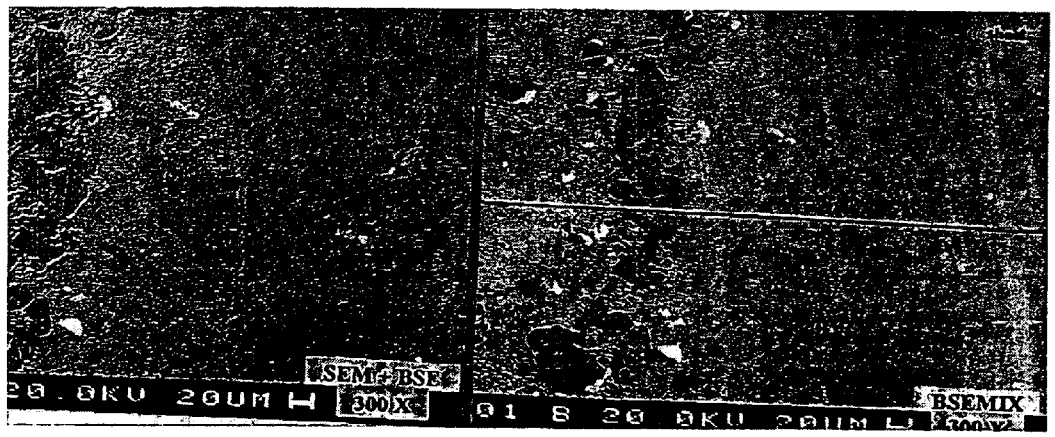
FIG. 5 comprises two photomicrographs showing the bonded joint between a thin skin and a superalloy substrate in accordance with an embodiment of the present invention.

FIG. 5 includes two photomicrographs showing the joint between a single crystal CMSX-4 pin and a single crystal nickel superalloy thin wall skin, demonstrating the excellent microstructures that are attained in these joints. The joint line runs vertically in each photomicrograph.

The present process can also be used to bond polycrystalline skins to single crystal substrates. Polycrystalline skins may be desired for several reasons including specialized chemistries that are more resistant to oxidation and/or hot corrosion, bondability of a thermal barrier coating layer, and highly contoured surfaces that require complex metal working of the thin wall, e.g., where recrystallization of a single crystal sheet would obviate its use. In this case, the process used to bond the polycrystalline skin to the single crystal substrate is more fully described below.

The present process can be used for placing the thin wall or skin over the central spar of an airfoil of a turbine blade. For example, as cooling of the shroud regions of turbine vanes becomes more critical in advanced engines, thin wall structures are highly advantageous in these regions and the present process can be used to fabricate the thin walls in the shroud regions of vanes as well as in the airfoils.

Transient liquid phase bonding is a joining process that produces high quality joints in superalloys. In this isothermal process, a thin strip of bonding material, e.g., foil or agglomerate paste, is placed between the two portions of the material to be bonded. The bonding material is similar to the base material but it also contains an extra addition of a melting point depressing element that also exhibits rapid solid state diffusion in the alloy. For nickel base alloys, Si and B are preferred melting point depressants. For high temperature applications, such as those requiring bonded single crystal components, B is preferred because Si can cause corrosion problems.

The bonding process is conducted substantially isothermally at a temperature that lies above the melting point of the foil but below the bulk melting point of the base material. As the boron rich foil melts, it wets the base material on either side of the bond and causes some dissolution of the base metal which provides a wider liquid zone. As the liquid zone widens, the concentration of boron in the liquid falls until the melt pool is sufficiently diluted in B that it is at the equilibrium liquidus concentration. Simultaneously, solid state diffusion causes boron to be removed from the bond pool region. These two processes result in depletion of the melting point depressant from the bond pool and isothermal resolidification of the bond pool until the two solidification fronts meet at approximately the center line of the bond.

By carefully controlling the chemistry of the bond medium and the temperature of the bonding process, the present isothermal bonding process can be controlled to reproduce the chemistry and microstructure of the base material within the bond zone.

During the bonding process, certain parameters are preferably controlled. The amount of melting point depressant should be sufficient to provide a bonding foil that will melt significantly (i.e., a few hundred °F.) below the base material. The bonding temperature should be sufficient to melt the bond foil and a similar thickness of the base material to produce a fine, well mixed bond zone. The amount of bonding foil should be sufficient to produce melting of the base material and provide a fine well controlled bond joint. The bond zone melting and resolidification should be sufficiently well controlled that deleterious chemical and phase separation does not occur within the bond zone. The major element chemistry of the bond foil (i.e., Ni, Cr, Co, Al, Ti, Ta, W, Mo, Nb etc.) should be sufficiently well matched to the material to be bonded that the chemistry and structure of the bond zone are effectively continuous with those of the base material. The bond foil composition does not have to be identical to that of the base material since some mixing will take place in the molten zone. Also, because Al and Ti will segregate to the final material to solidify, these elements may be removed from the bond foil in order to avoid the formation of deleterious γ' eutectics at the bond center line. In addition, in some applications, it may be preferred to control or match the crystallography across the bond, i.e., match the crystallographic orientations of the pieces to be bonded. The base material composition and its melting point, the bond foil major element composition, the amount of boron and the temperature for isothermal bonding are all interacting variables that determine the chemistry and structure of the bonds produced by the present process. The addition of B to a nickel base alloy depresses its melting point by about 100 to 150° F. per each weight percent addition. With melting points of over 2,400° F., and incipient melting points of the segregated as-cast form somewhat lower, foils comprising from about 1 to about 3 weight percent B can reduce the melting point to within the 2,000 to 2,300° F. regime which will allow for localized melting without overall melting. Although the major element composition of the bond foil is ideally very close to the base material, considerable differences can actually be tolerated. Because of the many alloying elements in a single crystal superalloy, small changes in the composition do not significantly affect the melting point. Also, dissolution of the base material into the bond zone melt pool tends to compensate for differences in bond foil and base metal composition. Furthermore, some expensive elements such as rhenium may not be desired in the foil in order to reduce costs. Finally, in order to suppress eutectic γ' formation during resolidification of the bond region, the titanium and aluminum contents of the bond foil should be reduced.

The present method may be applied to nickel base single crystal superalloy CMSX-4. The composition of the alloy is given in Table 1. Also listed in Table 1 are the compositions of several bonding foils that may be used to fabricate transient liquid phase bonds with single crystals of CMSX-4.

TABLE 1

Substrate Alloy and Bonding Foil Compositions (Weight Percent)

| Alloy | Ni | Cr | Co | Al | Ti | Nb | Mo | Ta | W | Re | Hf | Zr | B |
|---|---|---|---|---|---|---|---|---|---|---|---|---|---|
| CMSX-4 | bal | 6.6 | 9.6 | 5.5 | 1.0 | — | 0.6 | 6.5 | 6.4 | 3 | 0.9 | — | — |
| W-foil 1 | bal | 6.5 | 9.6 | 5.5 | 1.0 | — | 0.6 | 6.5 | 6.4 | 3 | 0.9 | — | 1.5 |
| W-foil 2 | bal | 6.5 | 9.6 | 2.9 | 0.5 | — | 0.6 | 6.5 | 6.4 | 3 | 0.9 | — | 1.5 |
| W-foil 3 | bal | 6.5 | 9.6 | 5.5 | — | — | 0.6 | 6.5 | 6.4 | 3 | 0.9 | — | 1.5 |
| W-foil 4 | bal | 6.5 | 10 | 2.9 | — | — | 0.6 | 6.5 | 6.4 | 3 | 0.9 | — | 1.5 |
| Ni-Flex 110 1.3B | bal | 10 | 5.0 | 2.0 | — | — | — | 4.0 | 4.0 | — | — | — | 1.3 |
| Ni-Flex 110 1.7B | bal | 10 | 5.0 | 2.0 | — | — | — | 4.0 | 4.0 | — | — | — | 1.7 |
| Ni-Flex 110 2.5B | bal | 10 | 5.0 | 2.0 | — | — | — | 4.0 | 4.0 | — | — | — | 2.5 |
| Ni-Flex 115 3.0B | bal | 9.0 | 8.0 | 2.0 | — | — | — | 4.0 | 4.0 | — | 1.0 | — | 3.0 |
| Ni-Flex 120 1.7B | bal | 10.0 | 5.0 | 1.3 | 1.0 | — | — | 5.0 | 3.0 | — | — | — | 1.5 |
| Ni-Flex 120 1.9B | bal | 10.0 | 5.0 | 1.3 | 1.0 | — | — | 5.0 | 3.0 | — | — | — | 1.7 |
| Ni-Flex 121 2.4B | bal | 10.0 | 10.0 | — | — | — | — | 5.0 | — | — | — | — | 2.4 |
| Ni-Flex 121 3.0B | bal | 10.0 | 10.0 | — | — | — | — | 5.0 | — | — | — | — | 3.0 |

The W-foils 1 to 4 listed in Table 1 are derivatives of the CMSX-4 alloy composition with 1.5 weight percent B added as a melting point depressant. The amounts of Al and Ti are adjusted to study the effect of eutectic γ' forming additions on the chemistry and structure of CMSX-4 bonds. The Ni-Flex foils are a series of commercial foils obtainable from Materials Development Corporation of Medford, Mass. Although the compositions of these foils appear to be significantly different from CMSX-4, excellent bonds were made with several of these foils as discussed below.

The bonding temperature is selected to lie between the melting point of the foil and the melting point of the base material. Since boron depresses the melting point of nickel alloys by about 100 to 150° F. per each weight percent addition, 1 to 3 weight percent boron will depress the melting point of the single crystal alloys from over 2,400° F. into the 2,000 to 2,300° F. range. Control of the bonding temperature with respect to the boron content determines the width of the bond zone, the elemental mixing that occurs on dissolution, and the segregation that occurs on resolidification. Higher temperature bonding allows for rapid wetting of the bond surfaces by the melted foil, good bond pool mixing, and accelerated solid state diffusion of the boron to increase the rate of resolidification process. Higher temperature bonding also allows the use of reduced B containing foils, thereby avoiding the need for extensive solid state diffusion and the potential formation of boride particles during the solidification process.

A bonding cycle of 2,250° F. for 4 hours is suitable for the bonding foils since this temperature produced controlled bond regions and did not appear to produce any deleterious γ' growth. Because of the large alloying content of the base alloy and the foil, the metallic element composition of the foils does not have a significant effect on the melting point depression of the base alloy. It does, however, have a significant effect on the chemical composition of the resolidified bond zone and the microstructure that is generated within the bond zone upon heat treatment. The chemical segregation of the elements within the bond zone after solidification is controlled by the bond zone size and the degree of dissolution of the base metal during the first stages of the bonding process. It is also affected by the state of the base material, i.e., segregated or homogenized. This issue is manifested in bonding of the as-cast CMSX-4 with high boron containing foils in which γ' eutectics are formed at the bond line due to preferential dissolution of the γ' enriched interdendritic regions of the segregated casting. The eutectic material is then redeposited at the bond line. This problem can be alleviated or avoided by using homogenized, solution treated CMSX-4 if high boron foils are used. In this case, the homogenized structure melts uniformly to produce a melt pool that is less enriched in the γ' eutectic forming elements. Consequently the resolidified bond zone does not display the deleterious γ' eutectics.

TABLE 2

Ramped Solution Heat Treatment Cycle for CMSX-4

| Time (minutes) | Temp (° C.) | Temp (° F.) |
|---|---|---|
| 0 | 23 | 73 |
| 60 | 1027 | 1880 |
| 80 | 1027 | 1880 |
| 110 | 1235 | 2255 |
| 140 | 1235 | 2255 |
| 170 | 1260 | 2300 |
| 185 | 1260 | 2300 |
| 215 | 1277 | 2330 |
| 335 | 1277 | 2330 |
| 365 | 1288 | 2350 |
| 485 | 1288 | 2350 |
| 500 | 1296 | 2365 |
| 680 | 1296 | 2365 |
| 695 | 1304 | 2380 |
| 875 | 1304 | 2380 |
| 890 | 1313 | 2395 |
| 1130 | 1313 | 2395 |
| 18 hours 50 minutes | | total cycle time |

Post bond heat treatment should generate the optimum chemistry and structure, not only on the bond region but also in the remaining portions of the base metal. This heat treatment cycle should homogenize the segregated structures obtained after casting and resolidification, and also cause the precipitation and growth of the optimum form of the strengthening γ' precipitates. Conventional solutioning and heat treatment cycles recommended for CMSX-4 may be adequate to achieve this. The solution treatment is a ramped heat treatment of the type identified in Table 2. By slowly increasing the temperature during this cycle, incipient melting is substantially avoided by allowing solid state interdiffusion that raises the local melting temperature. This process is effective in homogenizing as-cast single crystals, and it is also effective in homogenizing the resolidified bond zone. Furthermore, it is effective in increasing dispersion of the boron through the single crystal to prevent melting of the boron enriched bond line. For example, the slow temperature ramp helps avoid the potential problem that the bond zone developed after 4 hours at 2,250° F. may have a melting point below the peak solution treating temperature of 2,408° F. for base material CMSX-4. The potential exists for shortening this cycle since the 4 hours at 2,250° F. will have assisted in homogenizing the segregated single crystal, and diffusion of boron is more rapid than diffusion of the metallic alloying elements.

After solution heat treatment, a precipitation heat treatment sequence is preferably applied to generate the optimum form of the strengthening γ' precipitates. A treatment of 2,084° F. for 4 hours and 1,650° F. for 24 hours may be applied to generate approximately 0.5 μm cuboidal primary γ' precipitates and a dispersion of spheroidal secondary and tertiary γ' precipitates in the matrix channels between the cuboids. By applying these heat treatments which have been developed for processing the base single crystal alloy, the microstructure in the unbonded portions of the bonded part are optimally heat treated in a addition to the bonded region.

The preferred conditions for bonding CMSX-4 single crystals is to use a 1.3 weight percent B foil, bonding at 2,250° F. for 4 hours followed by solution heat treatment using a ramped heat treatment up to 2,408° F., holding for 4 to 6 hours, cooling to room temperature, and subsequently precipitation heat treating at 2,084° F. for 4 hours and 1,650° F. for 24 hours. This process generates the preferred structure. Other variations of this process can be employed to generate acceptable microstructures.

Table 3 shows how foils identified in Table 1 can be processed to deliver uniform bond structures. This table also identifies some of the key microstructural features that are developed during processing.

TABLE 3

Structure of Transient Liquid Phase Bonds of CMSX-4 During Bond Processing and Heat Treatment Sequence

| Foil | Structure After Bonding | Structure After Solution Treatment | Structure After Precipitation Treatment | Preferred Process Cycle |
|---|---|---|---|---|
| W-foil 1 (1.5% B) | Clean bond region, i.e. no particles | No large particles; uniform preliminary γ' particles | Uniform γ'; cuboidal; well formed | Bond in as-cast condition |
| W-foil 2 (1.5% B) | Clean bond region, i.e. no particles | No large particles; uniform preliminary γ' particles | Uniform γ'; cuboidal; well formed | Bond in as-cast condition |
| W-foil 3 (1.5% B) | Clean bond region, i.e. no particles | No large particles; uniform preliminary γ' particles | Uniform γ'; cuboidal; well formed | Bond in as-cast condition |
| W-foil 4 (1.5% B) | Clean bond region, i.e. no particles | No large particles; uniform preliminary γ' particles | Uniform γ'; cuboidal; well formed | Bond in as-cast condition |
| Ni-Flex 110 (1.3% B) | Always clean bond region | No large particles; uniform precuboidal γ' particles | Extremely sharp γ' particles; cuboidal; identical to base | Bond in as-cast condition |
| Ni-Flex 110 (1.7% B) | Always clean bond region | No large particles; Uniform precuboidal γ' particles | Very sharp γ' particles; cuboidal; very similar to base | Bond in as-cast condition |
| Ni-Flex 110 (2.5% B) | Particles when bonded in solution treated condition | Particles dissolve on solution treatment | Sharper γ' cuboids when sol treated material is bonded | Bond in solution treated condition |
| Ni-Flex 115 (3.0% B) | Particles when bonded in solution treated condition | Particles dissolve on solution treatment | Cuboidal γ'; rounded corners; larger than base material's | Bond in solution treated condition |
| Ni-Flex 115 (2.5% B) | Particles when bonded in solution treated condition | Particles dissolve on solution treatment | Cuboidal γ'; rounded corners; larger than base material's | Bond in solution treated condition |
| Ni-Flex 115 (1.7% B) | Always clean bond region | No large particles; uniform precuboidal γ' particles | Cuboidal γ'; rounded corners; larger than base material's | Bond in as-cast condition |
| Ni-Flex 120 (1.7% B) | Always clean bond region | No large particles; uniform precuboidal γ' particles | Very sharp γ'; very similar to base material | Bond in as-cast condition |
| Ni-Flex 120 (2.5% B) | Particles when bonded in solution treated condition | Particles dissolve on solution treatment | Very sharp γ'; very similar to base material; sharper in presolutionized material | Bond in solution treated condition |

In accordance with an embodiment of the present invention, skins comprising polycrystalline nickel base superalloys may be joined to substrates comprising single crystal nickel base superalloys. The polycrystalline and single crystal nickel base superalloys may be joined to each other using foil or paste bonding media and thermal cycles that are adapted from those that are used to bond the individual alloys to themselves. The alloys that can be joined are those for which the single crystal and polycrystalline alloys exhibit compositions that are sufficiently similar that they induce similar amounts of γ' and that the chemical compositions of the γ and γ' phases in the two alloys are also similar. Bonding of the alloys is accomplished by transient liquid phase bonding or the like, preferably using boron as the melting point depressant, and tailoring the foil alloying elements to match the base alloy compositions. The bonding thermal cycle is similar to the bonding thermal cycles for transient liquid phase bonding of the base materials to themselves. It occurs at a temperature that is adequate to melt the bond foil and localized regions of the single crystal and polycrystalline materials. The thermal cycle is of adequate duration to ensure that, after solidification, solid state boron diffusion is sufficient to raise local material melting temperatures above those to which the material is expected to be exposed.

The objective of using a high quality bonding process such as transient liquid phase bonding is normally to produce the identical chemistry and microstructure in the bond zone that exist in the bulk of the metal segments. This is generally achieved by matching the bond foil chemistry to the base metal chemistry, taking into account the preferential segregation that will occur during dissolution and resolidification. Elements such as Ti and Al should be reduced in the bond foil compared to the base metal since these elements will tend to segregate to the center of the bond line after solidification. Since polycrystalline and single crystal alloys typically have different chemical compositions, identical matching of the bond foil composition to each side of a single crystal-to-polycrystal bond joint is not possible. However, since some sets of alloys have similar compositions and volume fractions of gamma prime, it is possible to select similar polycrystalline and single crystal alloy compositions to be bonded, and to match their compositions with a bond foil that is used to bond either of the individual alloys.

Alloys that are sufficiently close in chemistry to effectively allow transient liquid phase bonding include: CMSX-4 and CM247; CMSX-4 and CM186; PWA1480 and MarM247; and SC-16 and IN738. These alloys contain similar chemistries. The alloy pairs are also selected so that chemistry mixing during transient liquid phase bonding is insufficient to cause the formation of deleterious precipitates, e.g., the stability impairing topographically close packed (TCP) phases that can form with excess Re, Cr, etc. These pairs give very good match of chemistry and hence give excellent properties across the bond zone. Using materials that are less well matched may produce deleterious phases in the bond zone and concomitant reduction in properties. However, this might be acceptable if strength requirements are not too high and other properties such as surface corrosion resistance are desired. The chemistries of the selected alloy pairs are controlled in order to conform to these constraints.

The bonding media may be those that are used for single crystal bonding. For the case of bonding CMSX-4 to CM247, Ni-Flex 110 comprising 1.3 weight percent B as a melting point depressant may be bonded at 2,250° F., which is the recommended bonding temperature for the single crystal alloy. The difference in bonding temperature for CMSX-4 and CM247 is only about 50° F., and the melting point depression incurred by additions of boron is about 100° F. per weight percent B. Thus, if the bonding points for the single crystal and polycrystalline materials are sufficiently close, they can generally be accommodated by using the bonding process for the higher melting single crystal material. Widening of the process parameters to allow for operational efficiency can be effected by increasing the amount of boron in the foil and adjusting the bonding temperature to be closer to that of the polycrystalline material.

The bonding foil chemistries are constrained by the previously described compositional requirements, i.e., similar to base metal, reduced Al, no Ti. One exception to this similarity is the need to incorporate expensive elements such as rhenium in the polycrystalline alloy. This is a commercial requirement since polycrystalline alloys rarely contain Re and third generation single crystals rely on the Re addition for their superior high temperature strength. An advantage of joining the two materials is to eliminate the cost of the rhenium from the skin of the structure. Since rhenium segregates to the matrix and stabilizes γ' by virtue of its slow diffusion, its elimination from the bond joint should not impair properties.

Table 4 shows the composition of several single crystal and polycrystalline alloys. From this table it can be observed that several sets of single crystal alloys are compositionally close to some polycrystalline alloys. For example, CMSX-4 and CM247 are sufficiently close in chemistry and structure to allow the production of good bonds using the transient liquid phase bonding process. This is because the effective difference in these alloys is the rhenium content which does not readily diffuse in the solid and liquid states. Moreover, a gradient of rhenium across the bond zone provides a gradual transition in structure and properties that is not harmful to the performance of the bond joint. Because of the expense of rhenium, it is desirable to join rhenium containing single crystals to non-rhenium containing polycrystalline alloys.

Table 5 shows exemplary bonding alloys that can be applied to bond single crystal and polycrystalline alloys. Adequate alloy matching of aluminum rich single crystals can be obtained by bonding using Ni-Flex type alloys. These foils can also be used to bond the polycrystalline alloys of this type (CM247, MarM247, MarM002). Thus, these bond foils may be used to bond CMSX-4 type single crystal alloys to the similar class of polycrystalline alloys, e.g., CM247. Conversely, to bond chromium rich materials such as single crystal SC-16 to IN738 polycrystalline alloys, a foil such as MFB80/80A may be preferable.

TABLE 4

Single Crystal and Polycrystalline Nickel Base Superalloys (Weight Percent)

| Alloy | Ni | Cr | Co | Al | Ti | Nb | Mo | Ta | W | Re | Hf | Zr | B | C | Vol. % γ' |
|---|---|---|---|---|---|---|---|---|---|---|---|---|---|---|---|
| CMSX-4 | bal | 6.6 | 9.6 | 5.5 | 1.0 | — | 0.6 | 6.5 | 6.4 | 3 | 0.9 | — | — | — | 62 |
| PWA1484 | bal | 5 | 10 | 5.6 | 1 | — | — | 8.7 | 6 | 3 | 0.1 | — | — | — | 64 |
| PWA1480 | bal | 10 | 5 | 5 | 1.5 | — | — | 12 | 4 | — | — | — | — | — | 63 |
| SC-16 | bal | 16 | — | 3.5 | 3.5 | — | 3 | 3.5 | — | — | — | — | — | — | 41 |
| CMSX-11 | bal | 12.5 | 7 | 3.4 | 4.2 | 0.1 | 0.5 | 5 | 5 | — | 0.04 | — | — | — | ~45 |

TABLE 4-continued

Single Crystal and Polycrystalline Nickel Base Superalloys (Weight Percent)

| Alloy | Ni | Cr | Co | Al | Ti | Nb | Mo | Ta | W | Re | Hf | Zr | B | C | Vol. % γ' |
|---|---|---|---|---|---|---|---|---|---|---|---|---|---|---|---|
| CM247 | bal | 8.1 | 9.2 | 5.6 | 0.7 | — | 0.5 | 3.2 | 9.5 | — | 1.4 | 0.015 | 0.015 | 0.07 | 62 |
| MarM002 | bal | 9 | 10 | 4.7 | 1.7 | 1 | — | — | 12.5 | — | — | — | — | — | 57 |
| MarM002 | bal | 9 | 10 | 5 | 2 | 1 | — | — | 12.5 | — | 1.8 | 0.06 | 0.02 | 0.14 | 58 |
| MarM246 | bal | 9 | 10 | 5.5 | 1.5 | — | 2.5 | 1.5 | 10 | — | — | 0.06 | 0.015 | 0.15 | 65 |
| CM186 | bal | — | — | — | — | — | — | — | — | — | — | — | — | — | — |
| IN792 | bal | 12.4 | 9 | 4.5 | 4.5 | — | 1.8 | 3.9 | 3.9 | — | 1 | 0.02 | 0.015 | 0.08 | 45 |
| IN738 | bal | 16 | 8.5 | 3.4 | 3.4 | 0.9 | 1.75 | 1.75 | 2.6 | — | — | 0.1 | 0.01 | 0.11 | 37 |

TABLE 5

Bond Foil Chemistries (Weight Percent)

| Foil Type | Ni | Cr | Co | W | Ta | Mo | Fe | Hf | Al | Ti | B | C | Si |
|---|---|---|---|---|---|---|---|---|---|---|---|---|---|
| Ni-Flex 110 (1.3B) | bal | 10.0 | 5.0 | 4.0 | 4.0 | — | — | — | 2.0 | — | 1.3 | — | — |
| Ni-Flex 110 (1.7B) | bal | 10.0 | 5.0 | 4.0 | 4.0 | — | — | — | 2.0 | — | 1.7 | — | — |
| Ni-Flex 110 (2.5B) | bal | 10.0 | 5.0 | 4.0 | 4.0 | — | — | — | 2.0 | — | 2.5 | — | — |
| Ni-Flex 115 (3.0B) | bal | 9.0 | 8.0 | 4.0 | 4.0 | — | — | 1.0 | 2.0 | — | 3.0 | — | — |
| Ni-Flex 120 (1.7B) | bal | 10.0 | 5.0 | 5.0 | 3.0 | — | — | — | — | 1.0 | 1.5 | — | — |
| Ni-Flex 120 (1.9B) | bal | 10.0 | 5.0 | 5.0 | 3.0 | — | — | — | — | 1.0 | 1.7 | — | — |
| Ni-Flex 121 (2.4B) | bal | 10.0 | 10.0 | 5.0 | — | — | — | — | — | — | 2.4 | — | — |
| Ni-Flex 121 (3.0B) | bal | 10.0 | 10.0 | 5.0 | — | — | — | — | — | — | 3.0 | — | — |
| MBF20/20A | bal | 7.0 | — | — | — | 3.0 | — | — | — | — | 3.2 | 0.06 | 4.5 |
| MBF80/80A | bal | 15.2 | — | — | — | — | — | — | — | — | 4.0 | 0.06 | — |

As an example of bonding a single crystal alloy to a polycrystalline alloy, single crystal CMSX-4 may be bonded to polycrystalline CM247 alloy, as described previously. The bonding process employed was: mechanically polished surface to 0.05 micron finish; Ni-Flex 110 1.3B foil; 2,250° F. bond temperature; and 4 hour bond time.

Whereas particular embodiments of this invention have been described above for purposes of illustration, it will be evident to those skilled in the art that numerous variations of the details of the present invention may be made without departing from the invention as defined in the appended claims.

What is claimed is:

1. A land base gas turbine component comprising:
   a superalloy substrate having a plurality of extensions on the surface thereof;
   a thin skin comprising a single crystal material bonded to the extensions of the substrate; and
   a plurality of cooling channels located between the superalloy substrate and further defined by the area between the plurality of extensions.

2. The turbine component of claim 1, wherein the substrate comprises a single crystal nickel base superalloy comprising about 6.6 weight percent Cr, about 9.6 weight percent Co, about 5.5 weight percent Al, about 1 weight percent Ti, about 0.6 weight percent Mo, about 6.5 weight percent Ta, about 6.4 weight percent W, about 3 weight percent Re, about 0.9 weight percent Hf, and the balance Ni.

3. The turbine component of claim 1, wherein the thin skin comprises a single crystal nickel base superalloy.

4. The turbine component of claim 1, wherein the extensions comprise substantially cylindrical pins.

5. The turbine component of claim 1, wherein the substrate comprises a nickel base superalloy.

6. The turbine component of claim 1, wherein the substrate comprises a single crystal nickel base superalloy.

7. The turbine component of claim 1, wherein the thin skin is bonded to the superalloy substrate by transient liquid phase bonding.

* * * * *